US010003301B2

(12) United States Patent
Bracco

(10) Patent No.: US 10,003,301 B2
(45) Date of Patent: Jun. 19, 2018

(54) DRIVE CIRCUIT FOR AN OSCILLATOR

(71) Applicant: The Swatch Group Research and Development Ltd, Marin (CH)

(72) Inventor: Massimiliano Bracco, Le Landeron (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days. days.

(21) Appl. No.: 15/270,652

(22) Filed: Sep. 20, 2016

(65) Prior Publication Data
US 2017/0104454 A1    Apr. 13, 2017

(30) Foreign Application Priority Data

Oct. 9, 2015 (EP) ..................................... 15189081

(51) Int. Cl.
*H03B 5/08* (2006.01)
*H03B 5/32* (2006.01)
*H03K 3/02* (2006.01)
*H03B 5/06* (2006.01)
*H03K 21/38* (2006.01)

(52) U.S. Cl.
CPC ................. *H03B 5/32* (2013.01); *H03B 5/06* (2013.01); *H03K 3/02* (2013.01); *H03K 21/38* (2013.01)

(58) Field of Classification Search
CPC .. H03B 5/1228; H03B 5/1215; H03B 5/1212; H03B 5/1243; H03B 5/26; H03B 5/36; H03B 5/366; H03B 5/06; H03B 5/32; H03L 7/099; H03L 7/0812; H03L 1/00;
(Continued)

(56) References Cited

U.S. PATENT DOCUMENTS 7,479,838 B1 *  1/2009  Athas ...................... H03L 7/099
                                                          331/165
2007/0080854 A1  4/2007  Arayashiki et al.
(Continued)

FOREIGN PATENT DOCUMENTS

EP    1 184 966 A1    3/2002
EP    1 753 136 A1    2/2007
WO    WO 96/30996    10/1996

OTHER PUBLICATIONS

European Search Report dated Mar. 23, 2016 in European Application 15189081.1 filed on Oct. 9, 2015.

*Primary Examiner* — Arnold Kinkead
(74) *Attorney, Agent, or Firm* — Oblon, McClelland, Maier & Neustadt, L.L.P.

(57) ABSTRACT

The present invention concerns a drive circuit for driving an oscillator. The drive circuit comprises a first inductor comprising a first terminal and a second terminal; an electrical energy source connected to the first terminal; and a switching circuit connected to the second terminal and to the oscillator. The switching circuit is configured to operate at least in an off state, where it is configured not to feed electrical energy to the oscillator, and in an on state, where it is configured to feed electrical energy to the oscillator. The first inductor is arranged to store energy in its magnetic field when the switching circuit is in the off state, and, when the switching circuit is in the on state, the switching circuit is arranged to use at least some of the energy stored in the magnetic field to deliver a surge of current from the electrical energy source to the oscillator.

12 Claims, 2 Drawing Sheets

(58) Field of Classification Search
CPC .. H03L 1/02; H03L 7/24; H03L 1/026; H03K 3/02; H03K 21/38
USPC ............... 331/167, 117 FE, 158, 116 FE
See application file for complete search history.

(56) References Cited

U.S. PATENT DOCUMENTS

| | | |
|---|---|---|
| 2009/0027259 A1 | 1/2009 | Arayashiki et al. |
| 2010/0188057 A1 | 7/2010 | Tarng |
| 2010/0321124 A1 | 12/2010 | Rangarajan et al. |
| 2012/0267359 A1 | 10/2012 | Czimmek |
| 2013/0135057 A1 | 5/2013 | Roithmeier |

* cited by examiner

DRIVE CIRCUIT FOR AN OSCILLATOR

This application claims priority from European Patent application 15189081.1 of Oct. 9, 2015, the entire disclosure of which is hereby incorporated herein by reference.

TECHNICAL FIELD

The invention relates to the field of drive circuits for driving an oscillator circuit, such as a crystal oscillator used in watches, for example. The invention also relates to an electronic circuit comprising the drive circuit and the oscillator and to a method for driving the oscillator.

BACKGROUND OF THE INVENTION

The circuit diagram of FIG. 1 illustrates an electronic circuit 1 comprising a circuit 3 representing a crystal oscillator and a prior art drive circuit 5 for driving the crystal oscillator 3. As can be seen, the crystal oscillator is modelled by a first capacitor $C_1$, a second capacitor $C_2$, an oscillator inductor $L_O$, a resistor $R_O$, a third capacitor $C_3$ and a fourth capacitor $C_4$ connected in parallel with the second capacitor, the coil and the resistor. One of the electrodes of the first and third capacitors is connected to ground. In the circuit of FIG. 1, the drive circuit is modelled by an inverter circuit 7. This kind of drive circuit is currently widely used to drive crystal oscillators, for example. The inverter circuit 7 may comprise at least an n-type metal-oxide-semiconductor (MOS) transistor and a p-type MOS transistor, for example. The crystal oscillator and the drive circuit are connected so as to form a positive feedback circuit, which induces an oscillation.

The signal diagram of FIG. 2 illustrates the behaviour of the signals of the electronic circuit 1 of FIG. 1. It is to be noted that, to better illustrate the results, the resistor $R_O$ has been omitted. The first (top) graph illustrates the voltage of the second capacitor $C_2$ as a function of time. In other words this graph illustrates the oscillation of the crystal oscillator. The second graph illustrates the output current of the drive circuit over time, while the third graph shows the drive circuit output voltage. The drive circuit 5 of FIG. 1 drives the crystal oscillator 3 for a full half-cycle of the oscillation. In the second graph in FIG. 2, it can be seen that the current from the drive circuit flows in both directions during a semi-period of oscillation, which means that the energy in the oscillator inductor $L_O$ of the crystal oscillator 3 is not increased and the voltage across the crystal oscillator does not increase. Assuming ideal conditions, i.e. no resistance and every component ideal, then the current provided by the drive circuit 5 must be dissipated in the drive circuit 5. In a real application this means that the energy is dissipated in the parasitic resistance of the transistors of the drive circuit 5.

Thus it becomes clear that the electronic circuit illustrated in FIG. 1 is not optimal in terms of power consumption. More specifically, the current flow from the driver 5 is not in phase with the current flow of the crystal oscillator 3, and this causes power dissipation in the transistors of the driver 5. A further problem may arise due to the brief but significant current which may flow in the inverter 7 during each switching transition of the inverter 7. Such a transition current spike may arise if the inverter comprises an NMOS-PMOS transistor pair as mentioned above, where this pair effectively presents a short-circuit when both are momentarily on.

SUMMARY OF THE INVENTION

It is an object of the present invention to overcome the problems identified above related to oscillator drive circuits.

According to a first aspect of the invention, there is provided a drive circuit for driving an oscillator, the drive circuit comprising:

a first inductor comprising a first terminal and a second terminal;

an electrical energy source connected to the first terminal; and a switching circuit connected between the second terminal and the oscillator, the switching circuit being configured to operate at least in an off state, in which it conveys substantially no electrical energy to the oscillator, and in an on state, in which it conveys electrical energy to the oscillator, said switching circuit including a first switch and a second switch, wherein the first inductor is arranged to store energy in its magnetic field while the switching circuit is in the off state, and, when the switching circuit is in the on state, the switching circuit is arranged to use at least some of the energy stored in the magnetic field to deliver a surge of current from the electrical energy source to the oscillator, wherein the first switch is a first NMOS transistor and the second switch is a second PMOS transistor, and wherein gate terminals of the first and second MOS transistors are connected to a common node, a drain of the first NMOS transistor and a source of the second PMOS transistor being connected to the second terminal of the first inductor, and wherein the switching circuit is configured to be in the off state when the electrical potential at the common node is greater than a first threshold value, and in the on state when an electrical difference potential between the second terminal and the common node is above a second threshold value.

The proposed new solution has the advantage that the operation of the drive circuit is more energy efficient than the state of the art drive circuits for oscillators. This is achieved by avoiding short circuit current and by driving the oscillator in phase with the oscillations of the oscillator, as explained later more in detail.

According to a second aspect of the invention, there is provided an electronic circuit comprising the drive circuit and an oscillator driven by the drive circuit.

According to a third aspect of the invention, there is provided a method of driving the oscillator.

Other aspects of the invention are recited in the dependent claims attached hereto.

BRIEF DESCRIPTION OF THE DRAWINGS

Other features and advantages of the invention will become apparent from the following description of a non-limiting exemplary embodiment, with reference to the appended drawings, in which.

DETAILED DESCRIPTION OF AN EMBODIMENT OF THE INVENTION

Figure 1:
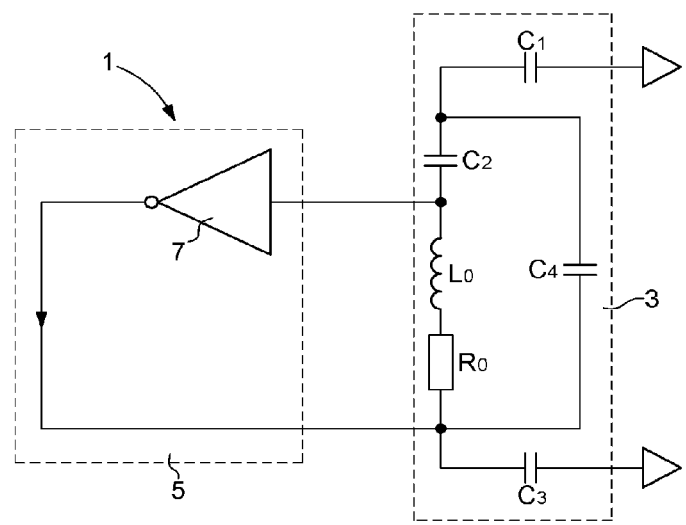
FIG. 1 is a circuit diagram illustrating a state of the art electronic circuit comprising a crystal oscillator and a drive circuit for driving the crystal oscillator.
Figure 2:
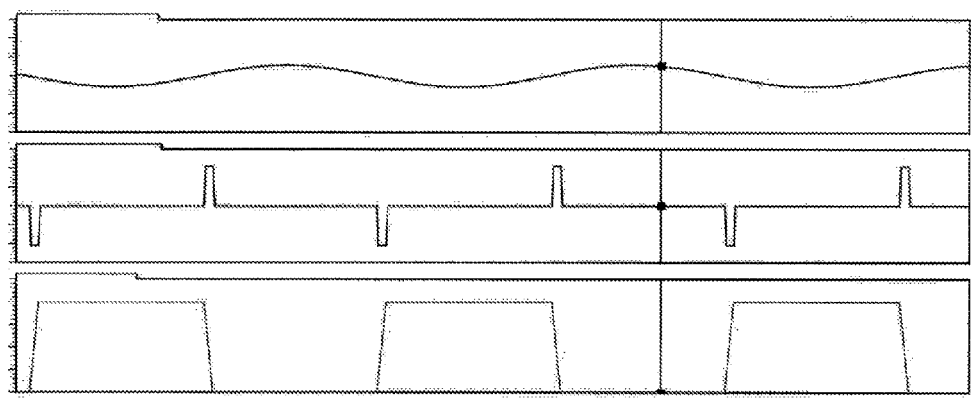
FIG. 2 is a signal diagram illustrating the behaviour of the signals in the electronic circuit of FIG. 1.

An embodiment of the present invention will now be described in detail with reference to the attached figures. The invention will be described in the context of a drive circuit for driving a crystal oscillator also known as a quartz of a watch. However, the disclosed drive circuit is not limited to be used in the context of crystal oscillators. Identical or corresponding functional and structural elements which appear in different drawings are assigned to the same reference numerals.

Figure 3:
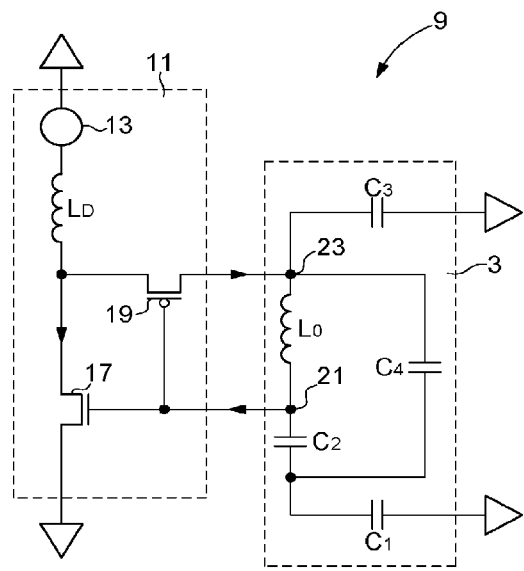
FIG. 3 is a circuit diagram illustrating an electronic circuit comprising a crystal oscillator and a drive circuit according to an embodiment of the present invention for driving the crystal oscillator.

FIG. 3 illustrates an electronic circuit 9 comprising a crystal oscillator 3, or more precisely a circuit representing the crystal oscillator 3, as in FIG. 1. However, in the crystal oscillator of FIG. 3, the resistor $R_O$ has been omitted. As can be seen, the drive circuit 11 according to this embodiment differs from the drive circuit 5 of FIG. 1. The drive circuit 11 comprises an electrical energy source 13, in this example a constant voltage source 13, connected between ground and a first terminal of a drive inductor $L_D$, also referred to as a first inductor. A second terminal of the drive inductor is connected to a switching circuit, which is also connected to the crystal oscillator 3 as shown in FIG. 3. The switching circuit in this example comprises a first switch 17 and a second switch 19. In this illustrated example, the first switch is an NMOS transistor 17, while the second switch is a PMOS transistor 19.

As can be seen in FIG. 3, the drain terminal of the NMOS transistor 17 is connected to the second terminal of the drive inductor $L_D$, while the source terminal of the NMOS transistor 17 is connected to ground. The gate of the NMOS transistor is connected to the crystal oscillator 3, and more particularly to a first node 21 located between the oscillator inductor $L_O$, also referred to as a second inductor, and the second capacitor $C_2$. The source of the PMOS transistor is connected to the second terminal of the drive inductor $L_D$ while the drain of the PMOS transistor 19 is connected to the crystal oscillator 3 and more specifically to a second node 23 located between the oscillator inductor $L_O$ and the third capacitor $C_3$. The gate of the PMOS transistor is connected to the first node 21.

In the present description, the NMOS transistor 17 is on (i.e. the channel from drain to source is conductive), when its gate-source voltage is positive, and more specifically with its gate voltage above a first threshold value, such as 0.5 V from the ground. In the present description, the PMOS transistor 19 on the other hand is on (i.e. the channel from source to drain is conductive) when its source-gate voltage is close to or greater than a second threshold of about 0.6 V. In this particular case, the second threshold value is greater than the first threshold value. This means that during a short time period the NMOS and PMOS transistors may both be conductive.

Next, the operation of the electronic circuit 9 is explained in more detail. In an initial state, when no electrical energy is supplied to the crystal oscillator 3, the capacitors of the crystal oscillator 3 are discharged and no current flows in the crystal oscillator. At this stage the gate voltages of the NMOS and PMOS transistors 17, 19 are 0 V and only the PMOS transistor is conductive. In other words the switching circuit is in an on state. When the voltage source 13 is turned on, current starts to flow through the drive inductor $L_D$ and through the conductive source-drain channel of the PMOS transistor 19 to the crystal oscillator 3. At this point, current starts to flow in the crystal oscillator 3, and the capacitors $C_1$, $C_2$, $C_3$, $C_4$ start to charge. At the same time, the gate voltages of the NMOS and PMOS transistors 17, 19 start to rise. This also means that the PMOS transistor 19 turns off as the NMOS transistor 17 turns on, with the result that the current no longer flows to the crystal oscillator 3, but flows instead through the conductive drain-source channel of the NMOS transistor 17 to ground. In this state, the switching circuit is in an off state. When the NMOS transistor 17 is on, the current flowing through the drive inductor $L_D$ stores energy temporarily in a magnetic field, for example in its coil. The drive inductor $L_D$ is therefore in a charging or energising state.

The crystal oscillator has thus now started to oscillate, thanks to the energy provided to it at the beginning. This means that NMOS transistor 17 turns off again, while the PMOS transistor 19 turns on, and the magnetic field energy is delivered as additional current flowing through the PMOS transistor 19 to the second node 23 in the crystal oscillator 3 to charge the capacitors in the crystal oscillator. In other words, at this point, the energy stored in the magnetic field "pushes" current from the voltage source 13 to the crystal oscillator 3. Now, the drive inductor $L_D$ is therefore in a discharging or de-energising state. The PMOS transistor 19 then turns off again, as the NMOS transistor 17 turns on. The operation explained above will then be repeated according to a given sequence while the crystal oscillator 3 continues to oscillate.

Figure 4:
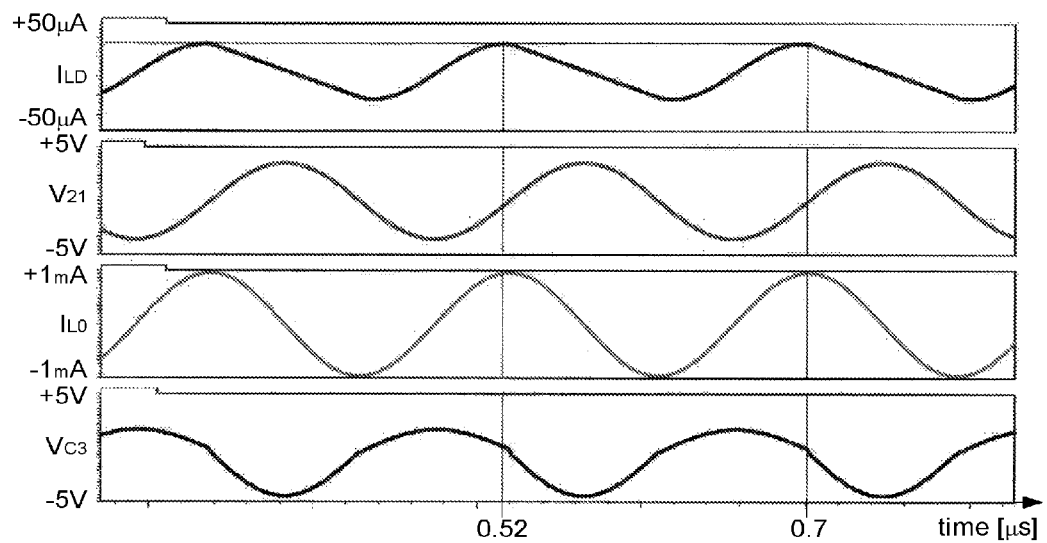
FIG. 4 is a signal diagram illustrating the behaviour of the signals in the electronic circuit of FIG. 3.

The signal diagram of FIG. 4 illustrates the behaviour of the signals in the electronic circuit of FIG. 3. The two vertical lines in the diagram of FIG. 4 show the duration of a full signal cycle. The first (top) graph shows the variation of the current through the drive inductor $L_D$. The second graph from the top illustrates the variation of the crystal oscillator voltage, i.e. the electrical potential at the first node 21. The electrical potential measured at this node substantially corresponds also to the electrical potential at the gates of the first and second transistors 17, 19. The third graph from the top shows the current flow in the crystal oscillator 3, i.e. the magnitude of the current flowing through the oscillator inductor $L_O$. Finally, the last graph illustrates the voltage of the crystal oscillator, i.e. the voltage across the third capacitor $C_3$. It is to be noted that the numerical values in FIG. 4 are merely exemplary and ignore the resistance in the crystal oscillator 3. The voltage maintained by the constant voltage source 13 is about 3 V in this example.

In view of the explanation above, the operation of the NMOS and PMOS transistors can be approximated by stating that the NMOS transistor 17 is on and the PMOS transistor 19 is off during a positive half-cycle of the crystal oscillator voltage (second graph from the top in FIG. 4); whereas the NMOS transistor 17 is off and the PMOS transistor 19 is on during a negative half-cycle of the crystal oscillator voltage. Thus, during a positive half-cycle of the crystal oscillator voltage, the magnetic field energy increases, and when the crystal oscillator voltage becomes negative (second graph in FIG. 4), the charge is pushed by the magnetic field of the drive inductor $L_D$ into the third capacitor $C_3$ (last graph in FIG. 4), thereby helping the oscillator inductor $L_O$ to increase its voltage again (second graph in FIG. 4).

As has been explained above, according to the present invention energy is temporarily stored in the drive inductor $L_D$. In this way, the short circuit current which occurs in the prior art drive circuits can be avoided, because the energy is stored in the drive inductor $L_D$ instead of being shorted to ground. Furthermore, the electrical energy from the voltage source 13 is injected to the crystal oscillator 3 synchronously (i.e. in phase) with the oscillations of the crystal oscillator, with the help of the energy stored in the drive inductor $L_D$. This means that the electrical energy is provided to the crystal oscillator 3 only at given time instants, and more particularly when the electrical potential at the first node 21 is below the second threshold value. Thus, according to the present invention, the crystal oscillator 3 is fed with the current from the drive circuit 11 only when the crystal oscillator is ready to receive this current. In other words, according to the present invention the drive circuit 11 is in phase with the crystal oscillator 3 and the crystal oscillator 3 is not driven against the current flow of the crystal oscillator 3. It is to be noted that the feed inductance, together with the oscillation frequency and the voltage of the constant voltage source 13 determine the amount of energy delivered to the oscillator 3 on each cycle. Thus, the value of the feed inductance may need to be tuned to the frequency, or to the particular oscillator.

The present invention also relates to a method of driving the crystal oscillator 3 by supplying electrical energy from an electrical energy source 13 to the oscillator 3 via the drive inductor $L_D$ such that the drive inductor $L_D$ is energised by the electrical energy source 13 during a first phase of the oscillator cycle, during which the oscillator 3 is in a non-receptive state, and such that at least some of the energy stored in the drive inductor $L_D$ during the first phase is used to transfer electrical energy from the electrical energy source 13 to the oscillator 3 during a second phase of the oscillator cycle, during which the oscillator is in an energy-receptive state.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. For instance, the number of terminals of the transistors can be more than three. The number of terminals in some variants is four. Moreover, the drive circuit can comprise further circuit elements, such as a capacitor precharging circuit for charging the capacitors of the oscillator, a current limiter for limiting the currents in the electronic circuit 11 and/or a control circuit for controlling the switching of the switches 17, 19 of the drive circuit 11 for example.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

What is claimed is:

1. A drive circuit for driving an oscillator, the drive circuit comprising:
    a first inductor including a first terminal and a second terminal;
    an electrical energy source connected to the first terminal; and
    a switching circuit connected between the second terminal and the oscillator, the switching circuit being configured to operate at least in an off state, in which the switching circuit conveys substantially no electrical energy to the oscillator, and in an on state, in which the switching circuit conveys electrical energy to the oscillator, said switching circuit including a first switch and a second switch, wherein the first inductor is configured to store energy in a magnetic field while the switching circuit is in the off state, and, when the switching circuit is in the on state, the switching circuit is arranged to use at least some of the energy stored in the magnetic field to deliver a surge of current from the electrical energy source to the oscillator, wherein the first switch is a NMOS transistor and the second switch is a PMOS transistor, and wherein gate terminals of the NMOS and PMOS transistors are connected to a common node, a drain of the NMOS transistor and a source of the PMOS transistor being connected to the second terminal of the first inductor, and wherein the switching circuit is configured to be in the off state when electrical potential at the common node is greater than a first threshold value, and in the on state when an electrical difference potential between the second terminal and the common node is above a second threshold value,
    wherein a drain of the PMOS transistor is connected to the oscillator.

2. The drive circuit according to claim 1, wherein the second threshold value is higher than the first threshold value.

3. The drive circuit according to claim 1, wherein the first and second threshold values are positive voltages.

4. The drive circuit according to claim 1, wherein the first and second threshold values are between 0 V and 1 V.

5. The drive circuit according to claim 1, wherein a source terminal of the first transistor is connected to ground, while the drain terminal of the NMOS transistor is connected to the second terminal.

6. The drive circuit according to claim 1, wherein the source terminal of the PMOS transistor is connected to the second terminal.

7. The drive circuit according to claim 1, wherein the electrical energy source comprises a constant voltage source.

8. An electronic circuit comprising the drive circuit according to claim 1 and the oscillator.

9. The electronic circuit according to claim 8, wherein the oscillator comprises a second inductor comprising a third terminal and a fourth terminal, and a capacitor connected in series with the second inductor, and wherein the drain terminal of the PMOS transistor is connected to the third terminal.

10. The electronic circuit according to claim 9, wherein gate terminals of the NMOS and PMOS transistors are connected to the fourth terminal.

11. The electronic circuit according to claim 8, wherein the operation of the switching circuit is configured to be controlled by electrical potential at the fourth terminal.

12. A method of driving an oscillator by a drive circuit for driving an oscillator, the drive circuit including a first inductor including a first terminal and a second terminal, an electrical energy source connected to the first terminal, and a switching circuit connected between the second terminal and the oscillator, the switching circuit being configured to operate at least in an off state, in which the switching circuit conveys substantially no electrical energy to the oscillator, and in an on state, in which the switching circuit conveys electrical energy to the oscillator, said switching circuit including a first switch and a second switch, wherein the first inductor is configured to store energy in a magnetic field while the switching circuit is in the off state, and, when the switching circuit is in the on state, the switching circuit is arranged to use at least some of the energy stored in the magnetic field to deliver a surge of current from the electrical energy source to the oscillator, wherein the first switch is a NMOS transistor and the second switch is a PMOS transistor, and wherein gate terminals of the NMOS and PMOS transistors are connected to a common node, a drain of the NMOS transistor and a source of the PMOS transistor being connected to the second terminal of the first inductor, and wherein the switching circuit is configured to be in the off state when electrical potential at the common node is greater than a first threshold value, and in the on state when an electrical difference potential between the second terminal and the common node is above a second threshold value, wherein a drain of the PMOS transistor is connected to the oscillator, the method comprising:

supplying electrical energy from an electrical energy source to the oscillator via an inductor such that the inductor is energized by the electrical energy source during a first phase of an oscillator cycle, during which the oscillator is in a non-receptive state, and such that at least some of the energy stored in the inductor during the first phase is used to deliver a surge of current from the electrical energy source to the oscillator during a second phase of the oscillator cycle, during which the oscillator is in an energy-receptive state.

* * * * *